United States Patent
Refai-Ahmed et al.

(10) Patent No.: US 8,868,944 B2
(45) Date of Patent: Oct. 21, 2014

(54) COMPUTING CENTER POWER AND COOLING CONTROL APPARATUS AND METHOD

(75) Inventors: Gamal Refai-Ahmed, Markham (CA); Stanley Ossias, Toronto (CA); Maxat Touzelbaev, San Jose, CA (US)

(73) Assignees: ATI Technologies ULC, Markham (CA); Advanced Micro Devices, Inc., Sunnyvale, CA (US)

(*) Notice: Subject to any disclaimer, the term of this patent is extended or adjusted under 35 U.S.C. 154(b) by 625 days.

(21) Appl. No.: 12/754,758

(22) Filed: Apr. 6, 2010

(65) Prior Publication Data
US 2011/0245981 A1   Oct. 6, 2011

(51) Int. Cl.
G06F 1/32 (2006.01)
H05K 7/20 (2006.01)
G06F 1/20 (2006.01)

(52) U.S. Cl.
CPC ............ *G06F 1/206* (2013.01); *Y02B 60/1285* (2013.01); *H05K 7/20836* (2013.01); *G06F 1/3296* (2013.01); *G06F 1/3203* (2013.01); *Y02B 60/1217* (2013.01); *Y02B 60/1275* (2013.01); *G06F 1/324* (2013.01)
USPC ............................. 713/320; 713/300; 713/323

(58) Field of Classification Search
USPC .................................................. 713/300–324
See application file for complete search history.

(56) References Cited

U.S. PATENT DOCUMENTS

| | | | |
|---|---|---|---|
| 7,533,283 B2 * | 5/2009 | Fung | 713/322 |
| 2003/0212474 A1 * | 11/2003 | Pippin | 700/300 |
| 2004/0268166 A1 * | 12/2004 | Farkas et al. | 713/320 |
| 2008/0204999 A1 | 8/2008 | Clidaras et al. | |
| 2009/0164812 A1 * | 6/2009 | Capps et al. | 713/320 |
| 2011/0022870 A1 * | 1/2011 | McGrane et al. | 713/340 |

* cited by examiner

*Primary Examiner* — Dennis M Butler
(74) *Attorney, Agent, or Firm* — Timothy M. Honeycutt

(57) ABSTRACT

Various computing center control and cooling apparatus and methods are disclosed. In one aspect, a method of controlling plural processors of a computing system is provided. The method includes monitoring activity levels of the plural processors over a time interval to determine plural activity level scores. The plural activity level scores are compared with predetermined processor activity level scores corresponding to preselected processor operating modes to determine a recommended operating mode for each of the plural processors. Each of the plural processors is instructed to operate in one of the recommended operating modes.

21 Claims, 9 Drawing Sheets

COMPUTING CENTER POWER AND COOLING CONTROL APPARATUS AND METHOD

BACKGROUND OF THE INVENTION

1. Field of the Invention

This invention relates generally to computing systems, and more particularly to methods and apparatus for controlling the behavior of multiple processors and cooling systems therefor.

2. Description of the Related Art

Explosive growth in data center construction has fueled a need for energy consumption awareness, both from the perspective of server power and data center cooling power. Modern servers routinely contain multiple processors and data centers scores or hundreds of servers. Spread out over hundreds of servers, processor power consumption can be enormous. Large numbers of servers and processors dissipate heat and require significant amounts of chilled air to both avoid thermal performance or shutdown issues and to operate at more electrically efficient temperatures.

Many conventional data centers use some form of localized air distribution network that is tailored at least theoretically to deliver varying amounts of cooling air to different locations. Such systems sometimes use motorized louvers to locally vary the air flow. One conventional control scheme for operating a data center cooling system relies on monitoring server room temperature and adjusting the cooling system output accordingly. Another conventional control scheme follows the same general approach, but attempts to achieve finer thermal mapping by monitoring room air temperature at multiple locations and vary air flow in a more localized fashion based on the thermal mapping.

The present invention is directed to overcoming or reducing the effects of one or more of the foregoing disadvantages.

SUMMARY OF EMBODIMENTS OF THE INVENTION

In accordance with one aspect of an embodiment of the present invention, a method of controlling plural processors of a computing system is provided. The method includes monitoring activity levels of the plural processors over a time interval to determine plural activity level scores. The plural activity level scores are compared with predetermined processor activity level scores corresponding to preselected processor operating modes to determine a recommended operating mode for each of the plural processors. Each of the plural processors is instructed to operate in one of the recommended operating modes.

In accordance with another aspect of an embodiment of the present invention, a method of cooling a computing system that includes plural processors and a cooling system capable of delivering a cooling fluid is provided. The method includes determining a first relationship between cooling system power consumption and temperature of at least one of the plural processors. A second relationship between power consumption of the at least one processor and temperature of the at least one of the processors is determined. A processor temperature at which the first and second relationships are approximately equal is determined. The processor power consumption and cooling power consumption are set at levels corresponding to the determined processor temperature using the first and second relationships.

In accordance with another aspect of an embodiment of the present invention, a system is provided that includes a controller. The controller is operable to monitor activity levels of plural processors over a time interval to determine plural activity level scores, compare the plural activity level scores with predetermined processor activity level scores corresponding to preselected processor operating modes to determine a recommended operating mode for each of the plural processors, and instruct each of the plural processors to operate in one of the recommended operating modes.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Various control apparatus useful for data center operations and related methods are disclosed. In one variant, a controller is linked to multiple processors and cooling system in a data center. The controller is operable to poll the multiple processors for several operating parameters, compare those polled parameters to vendor supplied sets of preferred operating conditions and adjust the settings of the processors as necessary to meet those preferred conditions. The controller is also operable to determine relationships between cooling power consumption and processor temperature and processor power consumption and processor temperature and based on those relationships determine optimum settings for both cooling power and processor power settings and make settings adjustments as necessary. Additional details will now be described.

Figure 1:
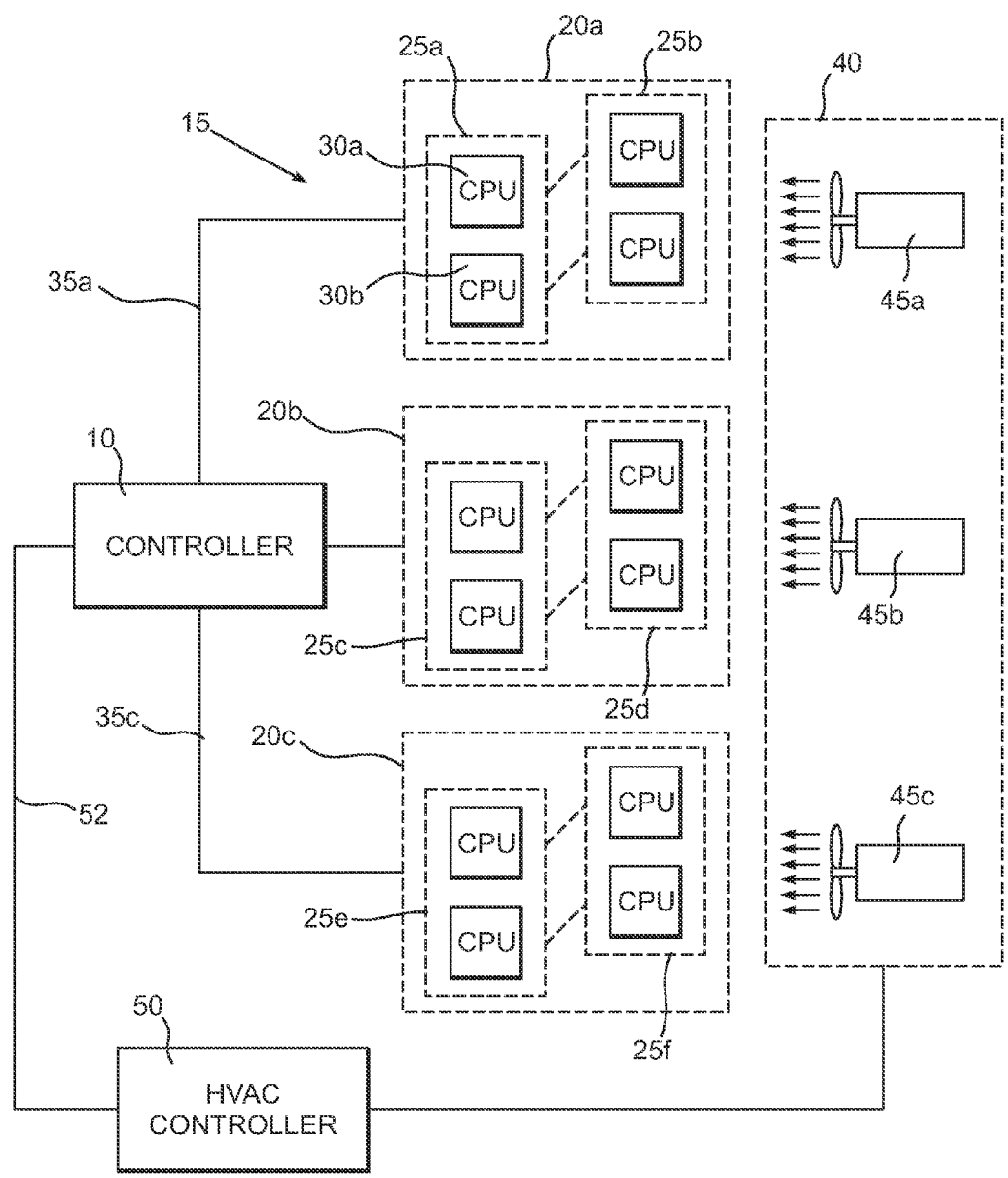
FIG. 1 is a schematic view of an exemplary embodiment of a controller that may be used to implement various control functions for a data center.

In the drawings described below, reference numerals are generally repeated where identical elements appear in more than one figure. Turning now to the drawings, and in particular to FIG. 1, therein is shown a schematic view of an exemplary embodiment of a controller 10 that may be used to implement various control functions for a data center 15. The controller 10 may be software, a server, a computer, an application specific integrated circuit or other type of computing device that includes appropriate programming instructions stored in a computer readable medium. The data center 15 may include plural racks 20a, 20b and 20c consisting of one or more servers 25a, 25b, 25c, 25d, 25e and 25f for example. As used herein, the term "server" may include servers, personal computers, or virtually any other computing device. A given server, such as the server 25a, may include one or more processors or CPUs 30a and 30b. For simplicity of illustration, the other processors or CPUs are depicted but not separately numerically labeled. The processors 30a and 30b may be microprocessors, graphics processors, combined microprocessor/graphics processors, application specific integrated circuits or other type of computing devices. It should be understood that the number of racks 20a, 20b and 20c, the number of servers 25a, 25b, etc. as well as the number of processors 30a and 30b for the data center 15 may be varied. The controller 10 is electrically tied to the plural servers 25a, 25b, 25c, 25d, 25e and 25f and the respective processors, for example, 30a and 30b thereof by way of respective communication links 35a, 35b and 35c. The communication links 35a, 35b and 35c may be wired connections, wireless connections or combinations of the two as desired. If additionally, and if desired, the communication links 35a, 35b and 35c may include electronic switches (not shown) in order to provide parallel linkages to all of the various servers 25a, 25b, etc. and the processors 30a and 30b, etc.

The data center 15 also includes a heating ventilating and cooling (HVAC) system 40 which may include one or more air delivery systems 45a, 45b and 45c capable of delivering air to the racks 20a, 20b and 20c, respectively. The air delivery systems 45a, 45b and 45c may be cooling fans, air registers or other types of air delivery mechanisms. The HVAC system 40 may be controlled by a HVAC controller 50 which may be a server, a computer, an application specific integrated circuit or other type of computing device and includes appropriate programming instructions stored in a computer readable medium. The HVAC controller 50 may be optionally electrically connected to the controller 10 by a communications link 52 and subject to control inputs from the controller 10 as described in more detail below. The communications link may be wired or wireless.

Figure 2:
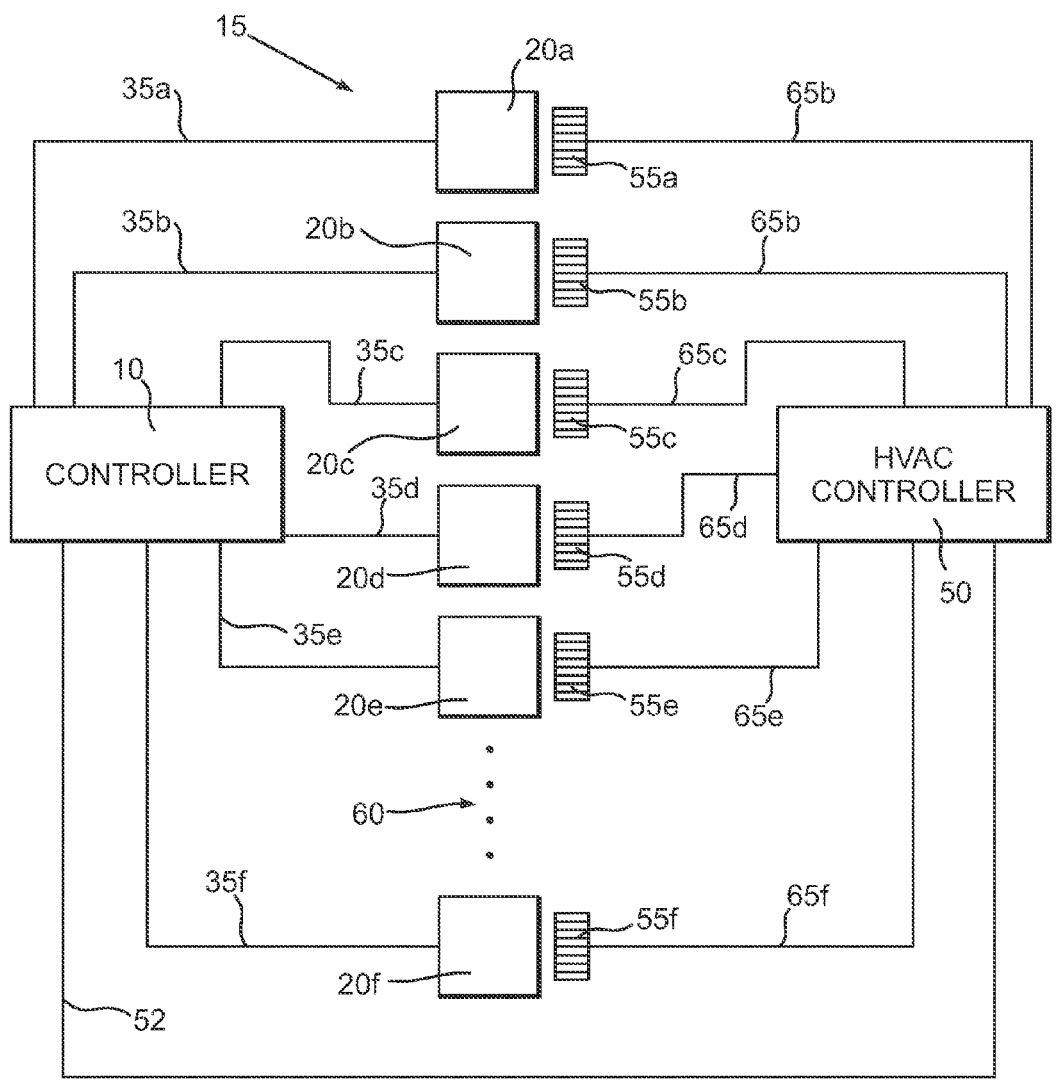
FIG. 2 is a more particularized schematic view of an exemplary controller for use with a data center.

Attention is now turned to FIG. 2, which is a schematic view of an exemplary embodiment of the data center 15 that utilizes plural air registers 55a, 55b, 55c, 55d, 55e and 55f as particular implementations of the air delivery mechanisms 45a, 45b and 45c, for example, depicted in FIG. 1. Here, the data center 15 is depicted with server racks 20a, 20b, 20c, 20d, 20e and 20f, with the dots at 60 illustrating the fact that the number of server racks may be varied depending upon the needs of the data center 15. The data center 15 includes the aforementioned controller 10 and the communications links 35a, 35b and 35c tied to the server racks 20a, 20b and 20c as well as additional communications links 35d, 35e and 35f tied to the racks 20d, 20e and 20f respectively. The registers 55a, 55b, 55c, 55d, 55e and 55f are operable to deliver selective quantities of air to the racks 20a, 20b, 20c, 20d, 20e and 20f and controlled by the HVAC controller 50. The HVAC controller 50 may be tied electrically to the registers 55a, 55b, 55c, 55d, 55e and 55f by way of respective communications links 65a, 65b, 65c, 65d, 65e and 65f. As noted above, the controller 10 may be tied electrically to the HVAC controller 50 by way of the communications link 52.

Figure 3:
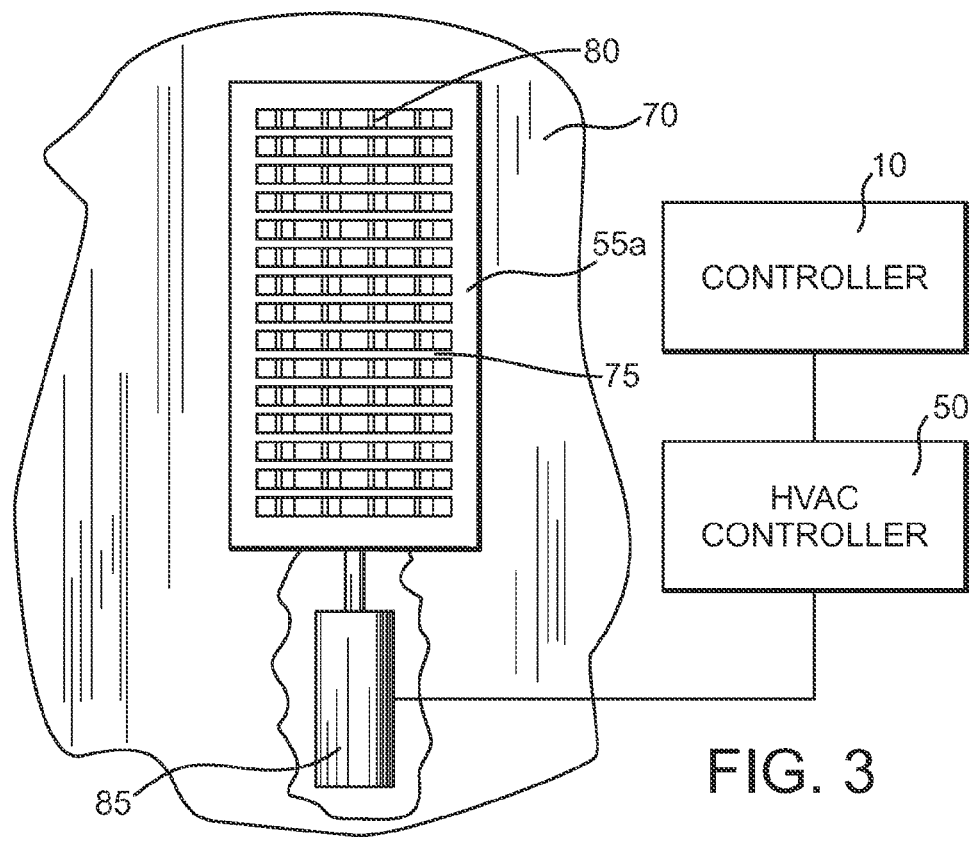
FIG. 3 is an overhead view of an exemplary air register.

An exemplary embodiment of a register, such as the register 55a depicted schematically in FIG. 2, may be understood by referring now to FIG. 3, which is an overhead view. Here, the register 55a is depicted as a floor register positioned on a floor 70 or other platform of the data center 15 depicted in FIG. 2. The register 55a may include plural grates 75 that cover an underlying set of movable louvers 80 tied to an actuator 85. The actuator may be a stepping motor or virtually any other type of machine capable of delivering rotational power. The actuator 85 may be electrically connected to the HVAC controller 50. The HVAC controller 50 is operable to instruct the actuator 85 to move the louvers 80 to various positions including open, closed or some intermediary positions in order to vary the air flow to a given server rack. As noted above, the controller 10 may be optionally connected to the HVAC controller 50 in order to provide control inputs to the HVAC controller 50 depending upon data center requirements to be described in more detail below.

Figure 4:
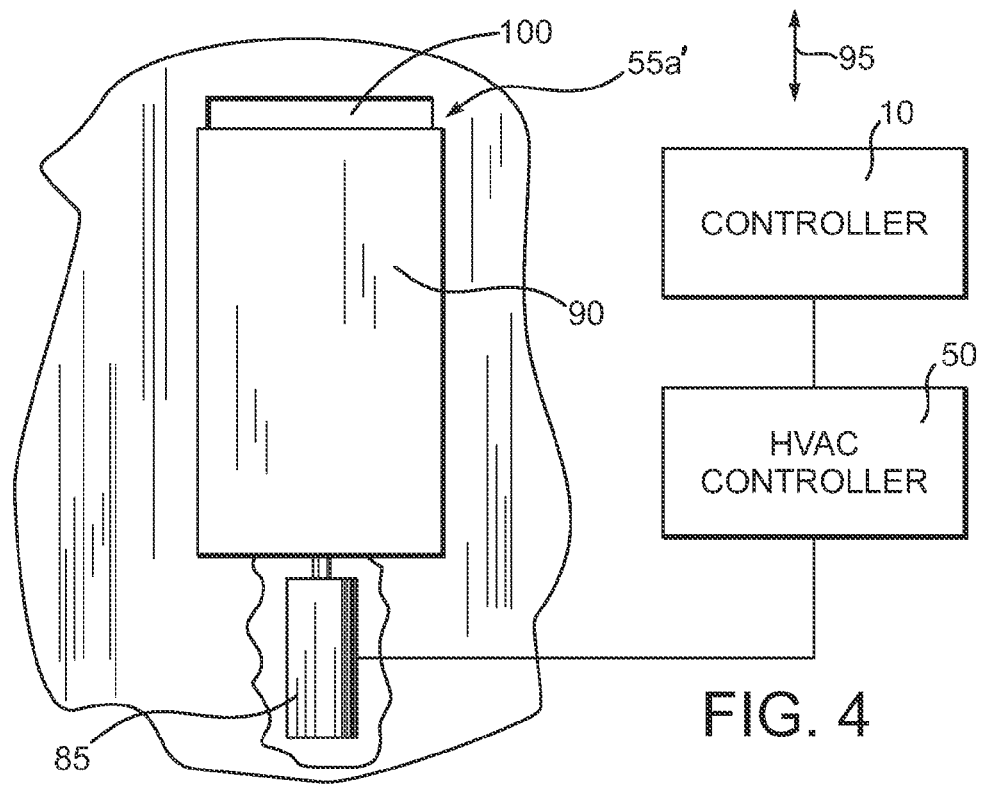
FIG. 4 is an overhead view of an alternate exemplary air register.

FIG. 4 is an overhead view of an alternate exemplary embodiment of a register 55a'. In this illustrative embodiment, the register 55a' may include a slidable door 90 that is operable to move either along an axis 95 to selectively cover or uncover portions of a floor opening 100 or to be rotated up and down out of the page in order to vary the air flow from the opening 100. The door 90 may be connected to an actuator 85' which may be connected to the HVAC controller 50 described elsewhere herein. The actuator 85' may be a linear motor, a stepping motor or virtually any other type of machine capable of delivering either linear or rotational power. The HVAC controller 50 may be optionally connected to the controller 10 as described elsewhere herein. The skilled artisan will appreciate that the type of register may take on a variety of different configurations in addition to those depicted herein.

Figure 5:
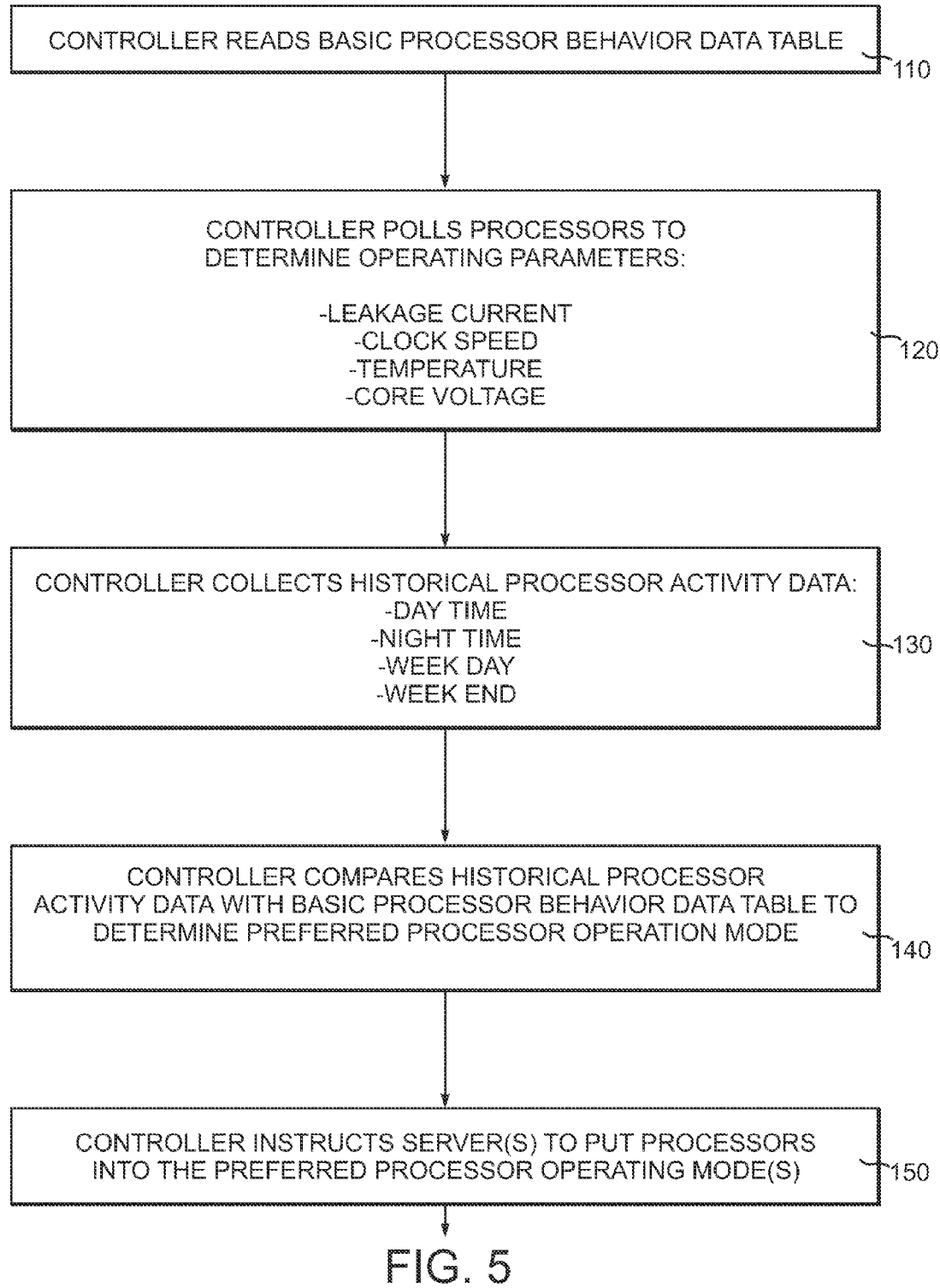
FIG. 5 is a flow chart of exemplary process control steps that may be performed by the controller.

An exemplary control scheme for the controller 10 depicted in FIGS. 1, 2, 3 and 4, may be understood by referring now to FIG. 1 and to FIG. 5, which is a flow chart depicting exemplary control operations. At step 110, the controller 10 reads basic processor behavior data for each processor, such as the processors 30a, 30b, etc. of the data center 15. The basic processor behavior data may be supplied by the processor vendor in the form of a table or matrix of parameters. The purpose of the basic processor behavior data table is to provide a set of preferred operating conditions for a processor, such as clock speed and core voltage, that depend on the type of software application being run, the power state and the expected leakage current of the processor. In essence, the basic processor behavior data table provides a yardstick to gauge actual processor activity. The following table provides an example of a basic processor behavior data table.

TABLE 1

| Processor Operation Mode | Processor Power Mode | Recommended Score | Processor Clock Speed | Processor Core Voltage (for a given leakage current $I_{leakage}$) |
|---|---|---|---|---|
| Idle | Power-no fault | X1 | Y1 | V1 |
|  | Power Failure | X2 | Y2 | V2 |
| Low Intensity application | Power-no fault | X3 | Y3 | V3 |
|  | Power Failure | X4 | Y4 | V4 |
| Medium Intensity application | Power-no fault | X5 | Y5 | V5 |
|  | Power Failure | X6 | Y6 | V6 |
| High Intensity application | Power-no fault | X7 | Y7 | V7 |
|  | Power Failure | X8 | Y8 | V8 |

The Processor Operating Mode is an indicator of how heavily a given processor is tasked at a given moment. Four or more categories may be assigned to the operating mode of a given processor. In this illustrative embodiment, the Processor Operating Mode categories may be Idle, Low Intensity Application, Medium Intensity Application and High Intensity Application. Idle as the name implies may represent an idle state for the processor. A Low Intensity Application may be, for example, performing spreadsheet calculations or other relatively low intensity type of computational task. A Medium Intensity Application may include, for example, more intensive types of computations and a High Intensity Application may include, for example, video or other types of relatively high intensity applications. The power mode operating condition may be broken up into a regular power mode and a backup power mode. A regular power mode may be for example operating on regular AC power whereas a backup power mode may reflect an operating condition for a processor where regular AC power is unavailable and backup power by way of batteries or otherwise is being used. For a given combination of Processor Operation Mode and Power Mode, a numerical Recommended Score X1, X2 . . . X8 and a corresponding Processor Clock Speed Y1, Y2 . . . Y8 are assigned by the vendor. The Recommended Score values may be based on any scale. For example, the Recommended Score values X1 to X8 may range from 10 to 100. The Processor Clock Speed values will be indexed proportionally to the score values. Thus, the clock speed Y1 will be relatively low since it is associated with the relatively low score X1 and an idle operation. The preferred values for Processor Core Voltage will depend on the anticipated leakage currents $I_{leakage}$. Higher anticipated values of $I_{leakage}$ translate into lower required Processor Core Voltage values. Here there are four Processor Operation Modes and eight total Score values. However, finer gradations could be used.

The controller 10 may read the data from the foregoing basic processor behavior data table in a variety of ways. For example, the data may be stored in the onboard memories of the processors that are readable by the controller 10. Alternatively, the controller 10 may pull the data from another computer system or location.

At step 120, the controller 10 polls the various processors, for example the processors 30a, 30b, etc. of the data center 15 for various parameters, such as leakage current, processor clock speed, processor temperature and core voltage. In the event that the processors are multi-core, then the core voltages, temperatures, clock speeds, etc. for each core may be pulled by the controller. These polled parameters are then stored within the controller or a memory or storage device associated with a controller. The polled processor parameters will be used for later decision making by the controller 10. This polling may be done on a highly periodic basis such as every few seconds or even less if desired.

At step 130, the controller 10 collects historical processor activity data. This collected data may be broken out into, for example, four categories such as day time, night time, week day and weekend and further broken out into subcategories such as daytime week day, daytime weekend, etc. A technical goal for step 130 is for the controller to obtain historical data that is reflective of how a given processor has been used historically over some period of days or weeks. A variety of mechanisms may be used by the controller 10 in order to obtain this historical processor activity level data. In one example, the controller may simply include software instructions enabling polling of processor activity data from the operating system running the processor. A commercial example of such would be obtaining processor activity data from Task Manager in a Windows® operating system environment for example. Before making a comparison with the basis processor behavior table, TABLE 1 above, the historical processor activity data must be converted into a series of scores using the same scale as the Score values X1, X2 . . . X8 described above. The scores may be stored in the form of a data table as follows:

TABLE 2

| Processor Operation Mode | Processor Power Mode | Historical Processor Activity Score |
|---|---|---|
| Weekday daytime | Power-no fault | Z1 |
|  | Power Failure | Z2 |
| Weekday nighttime | Power-no fault | Z3 |
|  | Power Failure | Z4 |
| Weekend daytime | Power-no fault | Z5 |
|  | Power Failure | Z6 |
| Weekend nighttime | Power-no fault | Z7 |
|  | Power Failure | Z8 |

In step 140, the controller compares historical processor activity data in TABLE 2 from step 130 with the basic processor behavior data from TABLE 1 and step 110. A simple numerical example will illustrate the process. Assume for the purposes of illustration that at step 130, the controller 10 has collected historical data for a given processor for weekday daytime operation. This historical activity data will be assigned some numerical value Z1 that uses the same scale as the Recommended Score values in TABLE 1. The controller 10 then compares the value Z1 with the various Recommended Scores in TABLE 1. Assume for the purposes of this illustration that the value Z1 falls between X5 and X7 and X7 is greater than X5. In this case, the controller 10 will pick the highest of the two Recommended Scores, in this case X7, and instruct the server or servers to put the processor or processors into the preferred corresponding Processor Clock Speed Y7 and core voltage.

The controller 10 may also take processor temperature into consideration when making the comparisons of TABLES 1 and 2. The controller 10 will determine if the processor temperature is below a critical operating temperature. If so, then the Processor Clock Speed Y7 would be selected. If, however, the temperature exceeds a critical temperature, then the next lower Processor Clock Speed, say Y5, would be selected and processor temperatures would continue to be monitored, and so on until the temperature falls below the critical temperature.

Figure 6:
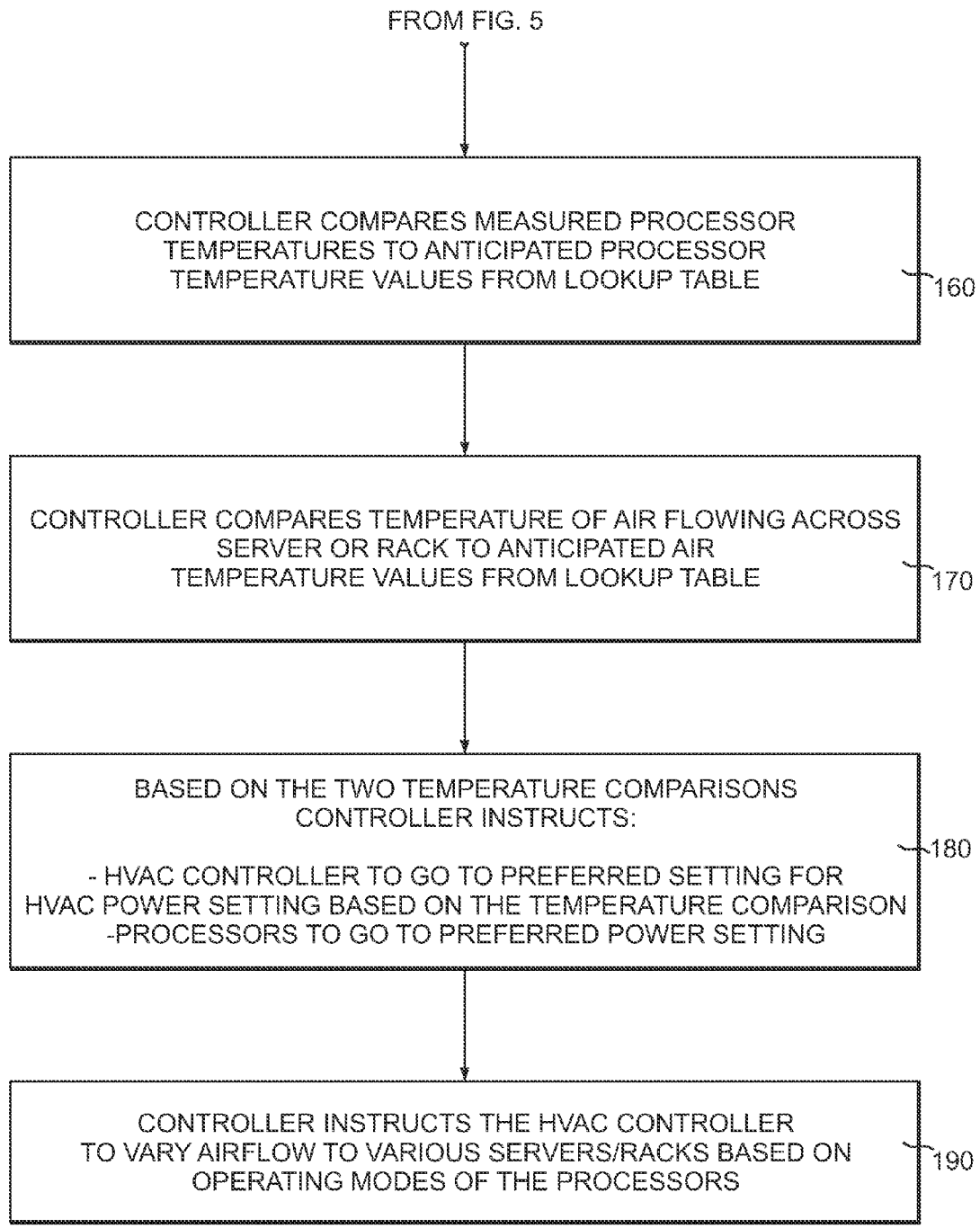
FIG. 6 is flow continuation of FIG. 5 depicting additional optional process control steps that may be performed by the controller.

The command and control functions of the controller 10 depicted in FIGS. 1-4 may be extended beyond the control steps 110 through 150 depicted in FIG. 5. In this regard, the controller 10 may be used to influence the operation of the HVAC system 40 depicted in FIG. 1 and described elsewhere herein. With that backdrop, attention is now turned to FIG. 6, which is a flow chart continuation of the flow chart depicted in FIG. 5. The steps 160, 170, 180 and 190 in FIG. 6 are optional additional process steps that the controller 10 depicted in FIG. 1 may be programmed to perform. At steps 160 and 170, the controller compares measured processor temperatures to anticipated processor temperature values from a look up table, and data center air temperature with anticipated data center air temperatures from another lookup table. The measured processor temperature values may be those gathered by the controller in step 120 depicted in FIG. 5. The generation of the two look up tables that include anticipated processor temperature and data center room temperature values will now be described.

Figure 7:
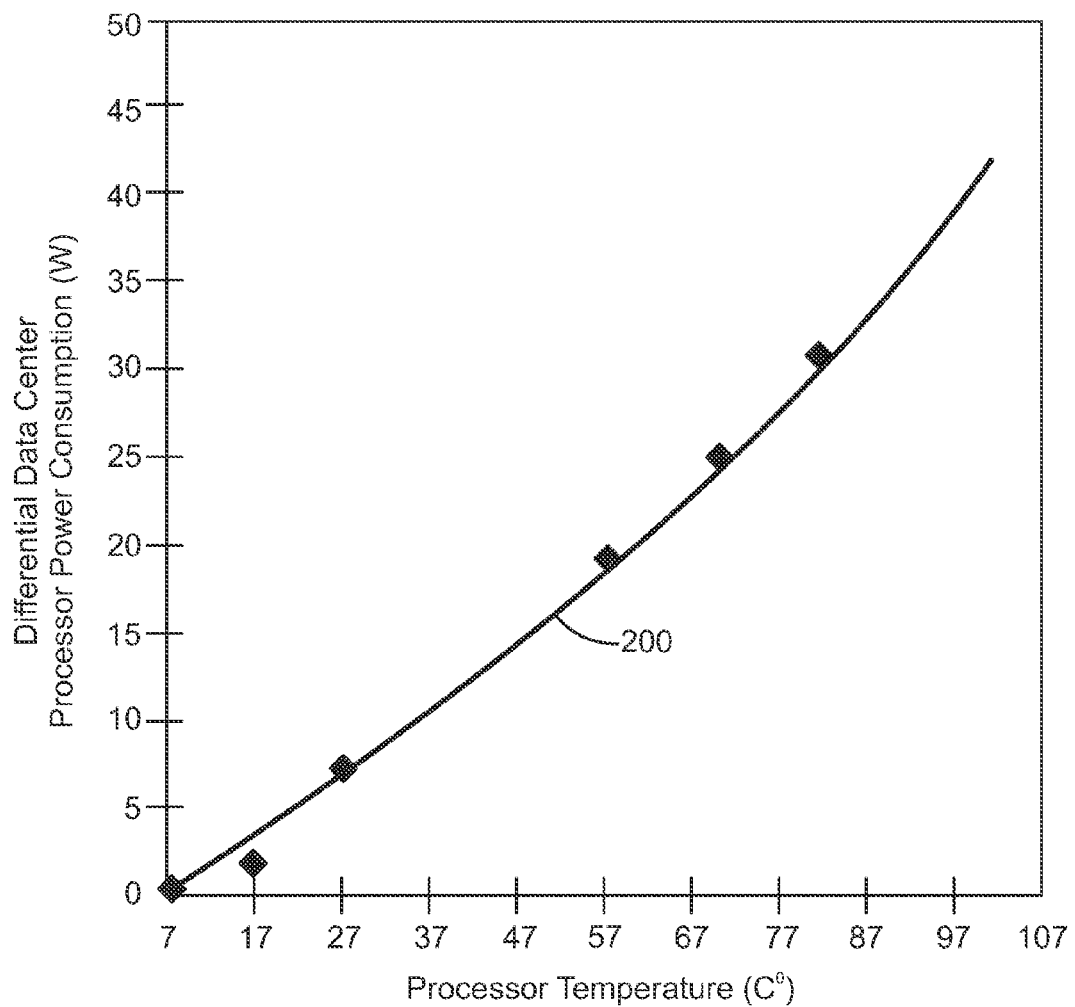
FIG. 7 is a plot of differential data center processor power consumption versus processor temperature.
Figure 8:
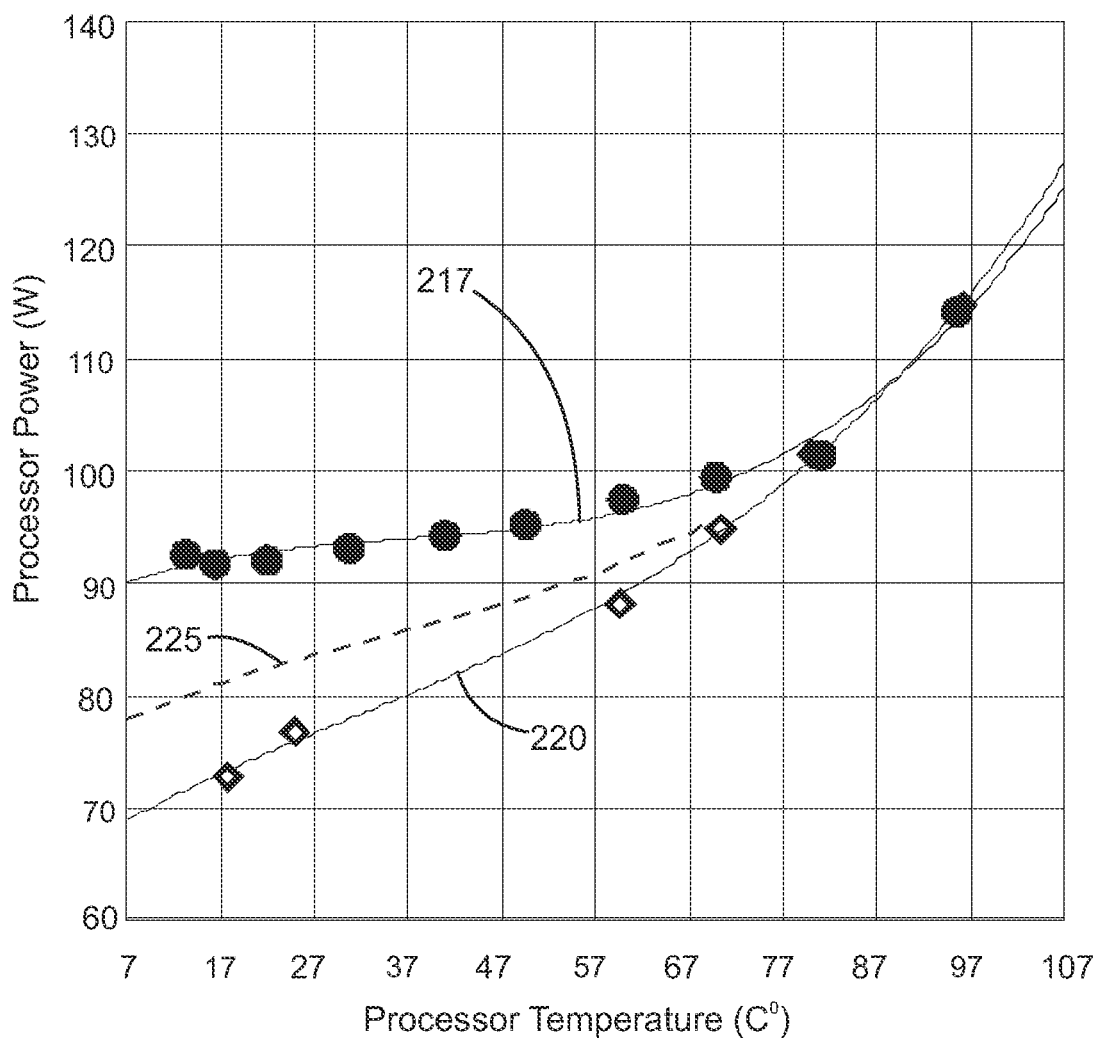
FIG. 8 is a graph of processor power versus processor temperature for two exemplary processors.

Attention is turned to FIG. 7, which is a plot 200 of Differential Data Center Processor Power Consumption for N Number of Processors in a data center versus Processor Temperature. The values for Differential Data Center Processor Power Consumption for N Number of Processors for the plot 200 may be obtained as follows. The relationship between processor power consumption and processor temperature is generally well understood and readily available or obtainable for modern integrated circuits. FIG. 8 depicts plots 217 and 220 of Processor Power as a function of Processor Temperature for two exemplary integrated circuits. The plot 217 represents the Processor Power as a function of temperature for an ATI model RV770 GPU and the plot 220 represents the Processor Power as a function of temperature for an ATI model RV600 GPU. The plot 225 is simply a plot of the average of the plots 217 and 220 over the temperature range of interest. If the y-values for the plot 200 in FIG. 7 are all based on the same type of processor, then one or the other of the plots 217 or 220 may be used to generate the individual processor power values. If however, the multiple types of processors are used then, for example, the average value represented by the plot 225 may be used for the processor power values to be used in FIG. 7 for the plot 200. Of course, if there are many types of processors involved in the data center then multiple averages or other aggregations of data may be used as well. To convert the processor power values of, for example, the plot 220 into the differential power consumption values of the plot 200 in FIG. 7, it will be necessary to subtract some baseline power consumption value from each of the processor power values of the plot 220 in FIG. 8. Here it may be convenient to use the lowest processor power value of about 70 W from the plot 220 as the baseline. Take the Processor Power at a temperature of 69 C.° as an example. The Processor Power at a processor temperature of 69 C.° is approximately 95 W. The processor power baseline of 70 W is subtracted from the 95 W value to yield a differential processor power value of about 25 W. The 25 W figure will constitute the differential data center processor power consumption value corresponding to a temperature of 69 C.° in FIG. 7. The same calculations are performed on the other processor power values using the 70 W baseline in FIG. 8 to yield the other differential values of FIG. 7.

Figure 9:
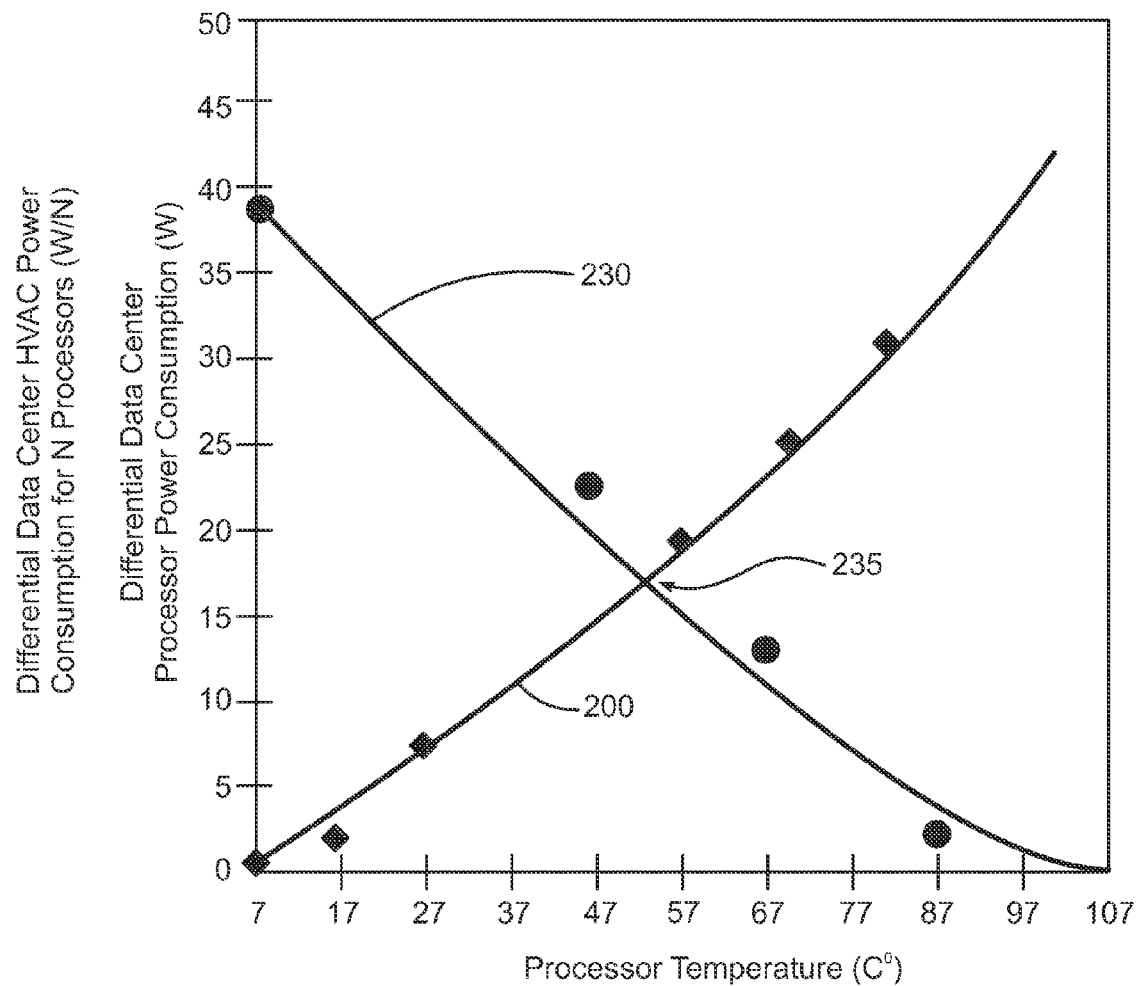
FIG. 9 is a multi-plot graph depicting differential data center processor power consumption versus processor temperature processor power versus processor temperature overlaid with differential data center HVAC power consumption versus processor temperature.

Not surprisingly, the plot 200 shows that as the operating temperature of a processor increases, the differential power consumption increases accordingly. Keeping processor temperatures low saves energy. However, there is a penalty to be paid in the form of HVAC power and cost in order to keep processor temperatures low. It is a logical empirical assumption that HVAC power consumption drops with increasing processor temperatures. Accordingly, it will be useful to overlay on FIG. 7 a plot of differential data center power HVAC consumption as a function of processor temperature and examine where that plot intersects with the plot 200. That intersection point would represent an optimum operating point from both a processor power consumption and HVAC power consumption standpoint. Such an overlay of plots is shown in FIG. 9, which includes a plot 230 of Differential Data Center HVAC Power Consumption for N Processors Versus Processor Temperature overlaid with the plot 200 of Differential Data Center Processor Power Consumption versus Processor Temperature. As the plot 230 shows, the Differential Data Center HVAC Power Consumption for N Processors goes down as the temperature of the air flowing across the processors is increased. This is not a surprising result since higher temperature air flow requires less power. The point 235 where the plots 200 and 230 cross represents an optimum operating state for the processors and the HVAC system. In other words, the values of the plot 230 for Differential Data Center HVAC Power Consumption for N Processors and the Differential Data Center Processor Power Consumption represent preferred settings for both the HVAC power consumption and the processor power consumption. The generation of the plot 230 will now be described.

Figure 10:
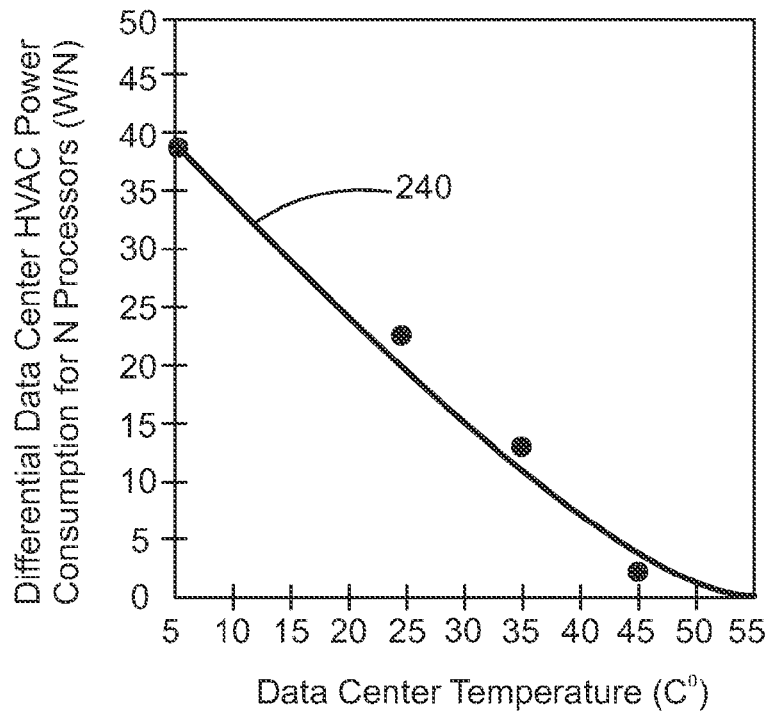
FIG. 10 is a plot depicting differential data center HVAC power consumption versus data center temperature.

Initially the relationship between Differential Data Center HVAC Power Consumption and data center air temperature is determined. FIG. 10 shows a plot 240 of Differential Data Center Hvac Power Consumption for N Processors versus Data Center Temperature. Acquiring data for the plot 240 is a straightforward matter. The data center 15 (FIG. 1) is cooled to various temperatures throughout some temperature range and HVAC power consumption is read, perhaps by the controller 10, the HVAC controller 50 or some other instrument, to yield HVAC power consumption values for particular temperatures. The appropriate temperature range for a typical data center may be about 5 to 50 C.° and such ranges may be determined by standards bodies, such as the American Society of Heating and Refrigeration or others. The measured HVAC power consumption readings may be divided by the number N of processors in the data center so that the data may be translated if desired to other data centers with different numbers of processors. In many data centers, the variable N may be several hundred or even several thousand. To obtain differential data center HVAC power consumption, some baseline power consumption is chosen and subtracted from the data points. For example, the power consumption at 50 C.° will typically be lowest and selected as the baseline. That baseline power consumption for 50 C.° will be subtracted from the power consumption at 45 C.°, 40 C.° and so on to yield the y-values for the plot 240 in FIG. 10.

The Differential Data Center HVAC Power Consumption for N Processors data values from FIG. 10 cannot be directly overlaid into FIG. 9 since those values are tied to Data Center Temperature and not Processor Temperature. It is thus necessary to determine a conversion between Data Center Temperature and Processor Temperature. Once that conversion is in hand, the Differential Data Center HVAC Power Consumption for N Processors data values as a function of Data Center Temperature from plot 240 in FIG. 10 can be converted to Differential Data Center HVAC Power Consumption for N Processors data values as a function of Processor Temperature to yield the plot 230 in FIG. 9. The conversion between Data Center Temperature and Processor Temperature will now be described.

Figure 11:
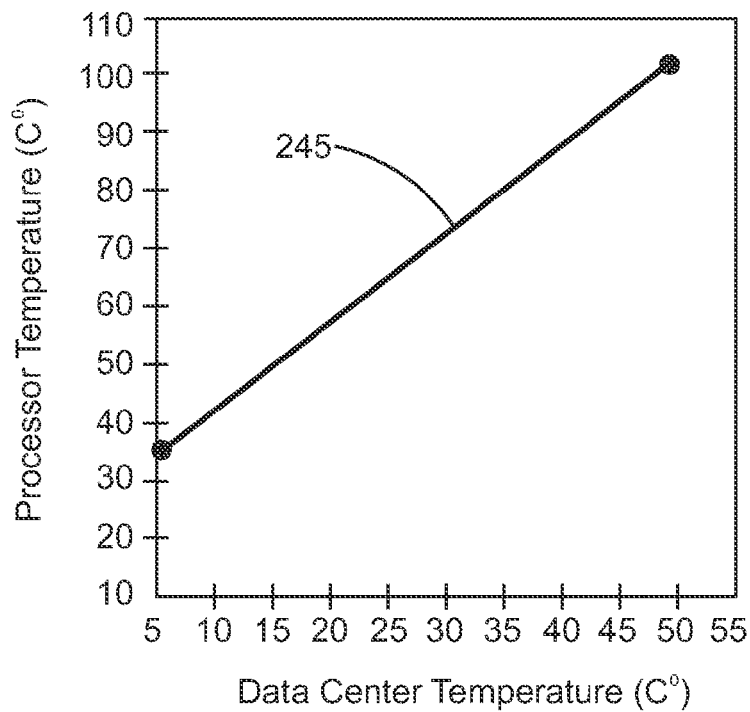
FIG. 11 is a plot depicting processor temperature versus data center temperature.

A 5 to 50 C.° Data Center Temperature range, a 100 w processor power setting and some constant air flow across a processor (or server or rack), and a processor operating temperature range of 7 to 107 C.° are assumed. The data center HVAC system 40 (FIG. 1) is set to deliver 50 C.° air and the air flow is modified until a processor temperature of 107 C.° is maintained. Next, the air temperature is dropped to 45 C.° while the air flow is kept at the same level and the processor temperature is read, perhaps by the controller 10 or other instrument. Next, the air temperature is dropped to 40 C.° with the same air flow and the processor temperature is read and so on for the entire 5 to 50 C.° air temperature range. The values of data center air temperature and corresponding processor temperature yield the plot 240 in FIG. 11. The plot provides the requisite conversion Between Data Center Temperature and Processor Temperature. Using the conversion provided by the plot 240, the Differential Data Center HVAC Power Consumption for N Processors data values as a function of data center temperature from plot 240 in FIG. 10 can be converted to Differential Data Center HVAC Power Consumption for N Processors data values as a function of processor temperature to yield the plot 230 in FIG. 9.

As noted above, the crossing point 235 represents an optimum operating point for both processor power and data center HVAC power. The crossing point 235 will now be further examined. Note that point 235 corresponds to a processor temperature of about 52 C.° and both a Differential Data Center Processor Power Consumption and a Differential Data Center HVAC Power Consumption per N Processors of about 17.5 W. The 17.5 W value represents a preferred processor power setting and a preferred HVAC system power setting. In addition, the data underlying the plots 200 and 230 may provide the lookup tables of anticipated processor temperatures and anticipated air temperature values referenced in steps 160 and 170 in FIG. 6 discussed above. Thus, at step 160 in FIG. 6, the controller 10 can compare measured processor temperatures to anticipated processor temperature values from a look up table, i.e., the plot 200, and the temperature of air flowing across a server or rack to the anticipated air temperature values from a look up table, i.e., the plot 230, and make adjustments to achieve the optimum point 235 in FIG. 9. If for example, the processor temperature is measured to be 47 C.°, then the controller 10 can instruct the processor to operate at a higher power setting corresponding to the optimum differential data center processor power consumption value of 17.5 W. At the same time the controller 10 or HVAC controller 50 can instruct (at step 180 FIG. 6) the HVAC system 40 (FIG. 1) to operate at a power setting that corresponds to the optimum processor air temperature corresponding to the optimum processor temperature of 52 C.° in FIG. 9. Recall that processor temperature may be converted to data center temperature by way of FIG. 11. Thus the optimum processor temperature of 52 C.° translates into a data center temperature of 18 C.°. The HVAC system can be commanded to output 18 C.° air.

It should be understood that at step 180, when the HVAC controller 50 is instructed by the controller to go to a preferred power setting, the HVAC controller 50 will be instructed to deliver some level of cooling air that is represented by some power value in kilowatts or other units. For example, the HVAC 50 controller may be instructed to deliver, for example, 15 kW of cooling air. However, because the data center 15 shown in FIG. 1 may have different cooling requirements across the various racks 20a, 20b, 20c, etc. the 15 kW of cooling power can be allocated or sub-divided into different cooling amounts for different racks. In this regard, and as set forth in step 190 shown in FIG. 6, the controller 10 instructs the HVAC controller 50 to vary the air flow to various servers/racks based on the operating modes of the processors. Here, the controller may, for example, determine that a given processor such as the processor 30a is operating in a medium application AC power mode such as shown in TABLE 1. However, the server 20b may be operating in a different mode. In this regard, the controller may instruct the HVAC controller 50 to provide greater air flow from the air delivery system 45a and a lesser amount from air delivery system 45b and thus divide up the 15 kW cooling power value differently among the various servers.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of controlling plural processors of a computing system, comprising:
monitoring activity levels of the plural processors over a time interval and based on that monitoring determining plural processor activity level scores, the plural processor activity level scores being based on a scale and broken out according to daytime versus nighttime, weekday versus weekend and regular power supply versus backup power supply;
comparing the plural processor activity level scores with processor vendor predetermined processor activity level scores also based on the scale and corresponding to preselected processor operating modes and based on that comparison determining a recommended operating mode for each of the plural processors; and
instructing each of the plural processors to operate in its recommended operating mode.

2. The method of claim 1, wherein the monitoring, comparing and instructing are performed by a controller.

3. The method of claim 2, wherein the controller includes instructions stored in a computer readable medium.

4. The method of claim 1, wherein the predetermined processor activity level scores include activity level scores corresponding to processor activity levels for plural software applications requiring differing levels of processor activity.

5. The method of claim 1, wherein the plural operating modes comprise plural processor clock speeds.

6. The method of claim 1, comprising monitoring a temperature of each of the plural processors, comparing the monitored temperatures to critical temperatures corresponding to each of the processors and instructing each of the plural processors to operate in a different operating mode if the monitored temperatures exceed the critical temperatures.

7. A method of cooling a computing system that includes plural processors and a cooling system capable of delivering a cooling fluid, comprising:
determining a first relationship between cooling system power consumption and temperature of at least one of the plural processors;
determining a second relationship between power consumption of the at least one processor and temperature of the at least one of the processors;
determining a processor temperature at which the first and second relationships are approximately equal; and
setting the processor power consumption and cooling power consumption at levels corresponding to the determined processor temperature using the first and second relationships.

8. The method of claim 7, comprising determining a third relationship between processor temperature and cooling air temperature and using the third relationship to set the cooling power consumption to a level corresponding to the determined processor temperature.

9. The method of claim 7, wherein the steps of determining and the step of setting are performed by a controller including instructions in a computer readable medium.

10. The method of claim 7, comprising allocating portions of delivered cooling fluid corresponding to the set cooling power consumption level to the plural processors based on a measured temperature of each of the plural processors.

11. The method of claim 10, wherein the allocating is not equal among the plural processors.

12. The method of claim 10, wherein the allocating comprises varying cooling fluid flow rate past a given of the plural processors using a flow control device.

13. The method of claim 12, wherein the flow control device comprises a louver.

14. A system, comprising:
a controller programmed with instructions stored in a computer readable medium to monitor activity levels of plural processors over a time interval to determine plural activity level scores, compare the plural activity level scores with predetermined processor activity level scores corresponding to preselected processor operating modes to determine a recommended operating mode for each of the plural processors, and instruct each of the plural processors to operate in its recommended operating mode; and wherein the controller is programmed to determine a first relationship between cooling system power consumption and temperature of at least one of the plural processors, determine a second relationship between power consumption of the at least one processor and temperature of the at least one of the processors, determine a processor temperature at which the first and second relationships are approximately equal, and set the processor power consumption and cooling power consumption at levels corresponding to the determined processor temperature using the first and second relationships.

15. The system of claim 14, wherein the system comprises a computing system including plural processors.

16. The computing system of claim 15, wherein the plural processors are positioned in at least two computer servers.

17. The computing system of claim 15, comprising a cooling system capable of delivering a cooling fluid to the plural processors.

18. The computing system of claim 14, wherein the controller is programmed to determine a third relationship between processor temperature and cooling air temperature and use the third relationship to set the cooling power consumption to a level corresponding to the determined processor temperature.

19. The computing system of claim 14, wherein the controller is programmed to allocate portions of delivered cooling fluid corresponding to the set cooling power consumption level to the plural processors based on a measured temperature of each of the plural processors.

20. The computing system of claim 19, wherein the allocation is not equal among the plural processors.

21. The computing system of claim 19, wherein the allocating comprises varying cooling fluid flow rate past a given of the plural processors using a flow control device.

* * * * *